United States Patent
Busch et al.

(10) Patent No.: US 9,603,279 B2
(45) Date of Patent: Mar. 21, 2017

(54) CENTRAL ELECTRONICS COMPLEX ('CEC') AND FAN STRUCTURE

(71) Applicant: LENOVO ENTERPRISE SOLUTIONS (SINGAPORE) PTE. LTD., Singapore (SG)

(72) Inventors: Diane S. Busch, Durham, NC (US); Alvin G. Davis, Durham, NC (US); William M. Megarity, Raleigh, NC (US); April E. Ruggles, Durham, NC (US); Paul A. Wormsbecher, Apex, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 47 days.

(21) Appl. No.: 14/589,232

(22) Filed: Jan. 5, 2015

(65) Prior Publication Data
US 2016/0198587 A1   Jul. 7, 2016

(51) Int. Cl.
*H05K 7/00* (2006.01)
*H05K 7/14* (2006.01)
*H05K 7/20* (2006.01)

(52) U.S. Cl.
CPC ....... *H05K 7/1488* (2013.01); *H05K 7/20727* (2013.01)

(58) Field of Classification Search
None
See application file for complete search history.

(56) References Cited

U.S. PATENT DOCUMENTS

| | | | |
|---|---|---|---|
| 5,638,895 A * | 6/1997 | Dodson | H01L 23/467 165/121 |
| 6,556,437 B1 * | 4/2003 | Hardin | H05K 7/20172 361/679.48 |
| 6,592,327 B2 | 7/2003 | Chen et al. | |
| 7,172,390 B2 | 2/2007 | Lu et al. | |
| 8,477,491 B1 * | 7/2013 | Ross | H05K 7/20736 361/679.48 |

(Continued)

FOREIGN PATENT DOCUMENTS

WO   WO 2010/138824 A2   12/2010

OTHER PUBLICATIONS

Ranganathan et al., "Ensemble-level Power Management for Dense Blade Servers", Proceedings of the 33rd International Symposium on Computer Architecture, Jun. 2006, 12 pages, IEEE Computer Society Washington, DC, USA.

*Primary Examiner* — Courtney Smith
*Assistant Examiner* — Zhengfu Feng
(74) *Attorney, Agent, or Firm* — Brandon C. Kennedy; Douglas W. Robinson; Kennedy Lenart Spraggins LLP

(57) ABSTRACT

A server chassis, including: a first compartment configured to receive one or more central electronics complexes ('CECs'); and a second compartment configured to receive one or more fans for cooling the one or more CECs, wherein the second compartment is coupled to the first compartment such that: the second compartment is inserted within the first compartment when the second compartment is in an operational position; and the second compartment is outside of the first compartment and rotated relative to the first compartment when the second compartment is in a service position.

16 Claims, 11 Drawing Sheets

(56) References Cited

U.S. PATENT DOCUMENTS

| | | | |
|---|---|---|---|
| 2006/0003683 A1* | 1/2006 | Chen .................. | H05K 7/20172 454/184 |
| 2008/0153345 A1 | 6/2008 | Chen et al. | |
| 2008/0257639 A1* | 10/2008 | Yamaguchi ........ | H05K 7/20736 181/198 |
| 2010/0110632 A1* | 5/2010 | Rose .................. | H05K 7/20727 361/695 |
| 2013/0063887 A1* | 3/2013 | Wang ................. | H05K 7/20736 361/679.48 |

* cited by examiner

Computing Device 802

Computing Device 802

CENTRAL ELECTRONICS COMPLEX ('CEC') AND FAN STRUCTURE

BACKGROUND OF THE INVENTION

Field of the Invention

The field of the invention is a CEC and fan structure.

Description of Related Art

Traditional rack servers have slides and cable management arms to allow hot replacement of fans and cards (PCIe, Memory, etc.). The cable management arm often times impedes access to PDUs (power distribution units), blocks air flow in the back of the system, makes it difficult to close the rack door, and actually makes cable routing more difficult. In addition, if not done properly, cable connections can break when the unit is slid out for service. Because of these negatives, many customers do not even install the cable management arm provided with their system.

SUMMARY OF THE INVENTION

A server chassis, comprising: a first compartment configured to receive one or more central electronics complexes ('CECs'); and a second compartment configured to receive one or more fans for cooling the one or more CECs, wherein the second compartment is coupled to the first compartment such that: the second compartment is inserted within the first compartment when the second compartment is in an operational position; and the second compartment is outside of the first compartment and rotated relative to the first compartment when the second compartment is in a service position.

The foregoing and other objects, features and advantages of the invention will be apparent from the following more particular descriptions of example embodiments of the invention as illustrated in the accompanying drawings wherein like reference numbers generally represent like parts of example embodiments of the invention.

DETAILED DESCRIPTION OF EXAMPLE EMBODIMENTS

Figure 1A:
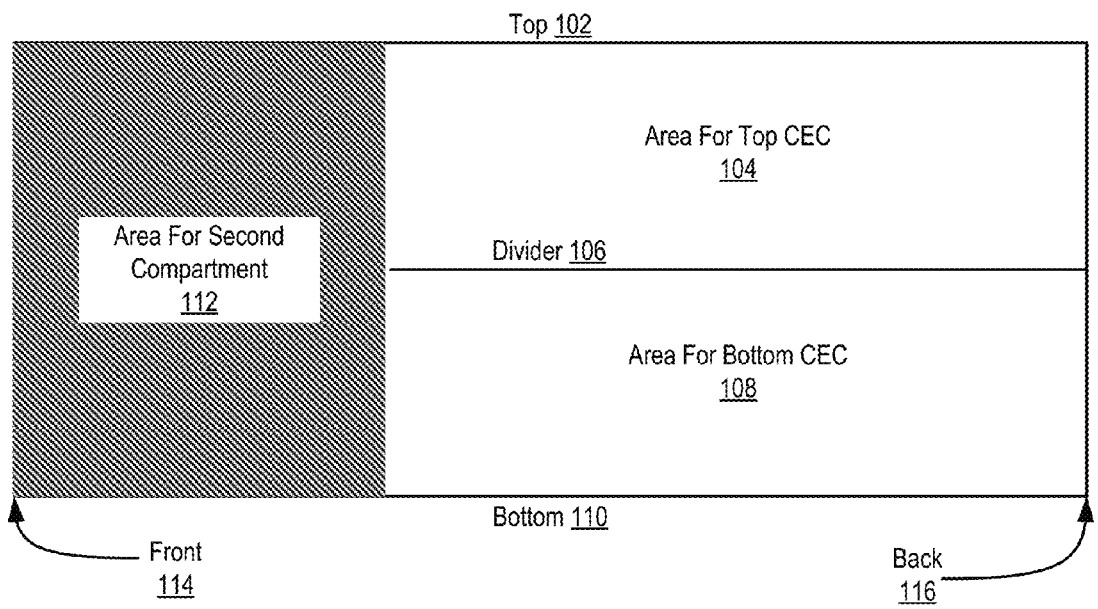
FIG. 1A sets forth a block diagram of a first compartment according to embodiments of the present invention.

Example apparatus and products in accordance with the present invention are described with reference to the accompanying drawings, beginning with FIG. 1A. FIG. 1A sets forth a block diagram of a first compartment according to embodiments of the present invention. A first compartment represents a portion of a server enclosure that is configured to receive one or more central electronics complexes ('CECs'). A CEC is an electronics module that can be mounted within a modular system. Such a CEC may include, for example, computer processors ('CPUs'), computer memory such as random access memory ('RAM'), a peripheral connect interface ('PCI') backplane, and other components. In such an example, each CEC may be mounted within a particular slot in the first compartment. Each slot in the first compartment can include connections to power sources, connections to data communications networks, and other interconnects so that a CEC that is inserted into a particular slot in a first compartment can be powered on and coupled for data communications with other components in the system.

FIG. 1A depicts a side-view of a first compartment that is defined by a top (102) side, a bottom (110) side, a front (114) side, and a back (118) side. In the example depicted in FIG. 1A, the first compartment is configured to receive two CECs—a first CEC that will reside in the area for the top CEC (104) and a second CEC that will reside in the area for the bottom CEC (108). The area for the top CEC (104) and the area for the bottom CEC (108) are referred to herein as 'slots' that may be separated by a divider (106). In such an example, each CEC is mounted with the first compartment by inserting the CEC into a particular slot of the first compartment via an opening at the front (114) side of the first compartment, and sliding the CEC towards the back (116) side of the first compartment. Each CEC may be mounted in a particular slot through the use of mounting rails, brackets, or other physical structures that allow the CEC to be secured with a particular slot of the first compartment.

In the example depicted in FIG. 1A, a first slot that a CEC may be inserted into is designated as the area for the top CEC (104) and a second slot that another CEC may be inserted into is designated as the area for the bottom CEC (108). In the example depicted in FIG. 1A, a CEC may be inserted into a particular slot by the inserting the CEC into the area for the top CEC (104) or the area for the bottom CEC (108) via an opening in the front (114) side of the first compartment. Readers will appreciate that in the example depicted in FIG. 1A, some portion of the first compartment is reserved for receiving a second compartment, such as a second compartment that includes one or more fans that cool the CECs that are inserted into the first compartment. In the example depicted in FIG. 1A, the portion of the first compartment that is reserved for receiving such a second compartment is designated as the area (112) for the second compartment.

In the exampled depicted in FIG. 1A, the area for the top CEC (104) and the area for the bottom CEC (108) are separated by a divider (106). The divider (106) depicted in FIG. 1A may be embodied, for example, as a metal plate that runs between the top (102) side of the first compartment and the bottom (110) side of the first compartment. In such an example, the divider (106) may not run the full length between the front (114) side of the first compartment and the back (116) side of the first compartment, as the divider (106) may be limited to a size necessary to separate two CECs inserted into the first compartment. The remaining area in the first compartment may be reserved, for example, for a second compartment that includes fans configured to cool the CECs inserted into the area for the top CEC (104) and the area for the bottom CEC (108).

Figure 1B:
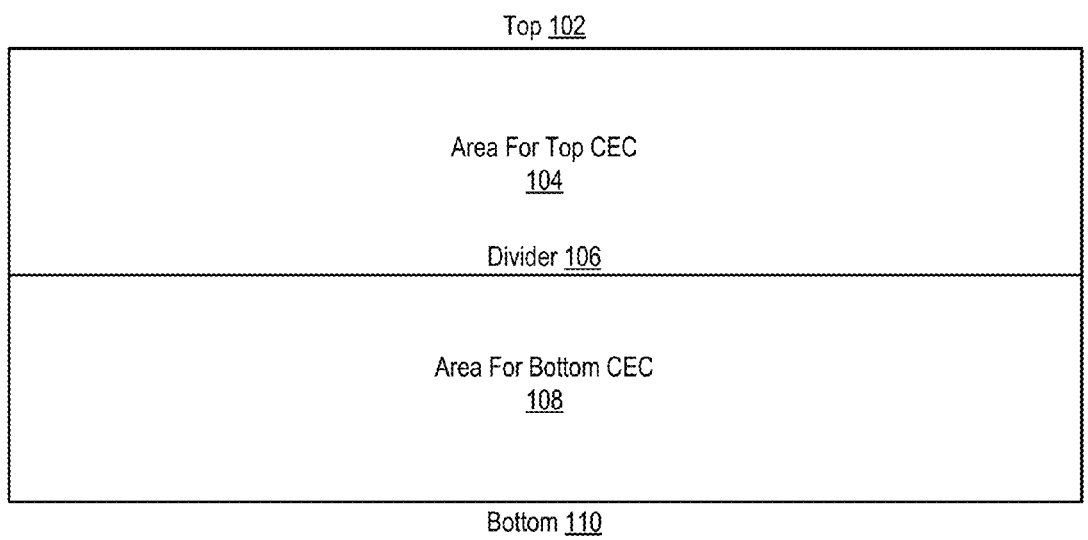
FIG. 1B sets forth a block diagram of a first compartment according to embodiments of the present invention.

For further explanation, FIG. 1B sets forth a block diagram of a first compartment according to embodiments of the present invention. FIG. 1B depicts a front-view of the first compartment where the first compartment is defined by a top (102) side, a bottom (110) side, a left-side wall (120), a right-side wall (122), and a divider (106) between the top (102) side and the bottom (110) side. In the example depicted in FIG. 1B, the first compartment is configured to receive two CECs—a first CEC that will reside in the area for the top CEC (104) and a second CEC that will reside in the area for the bottom CEC (108). In such an example, each CEC is mounted with the first compartment by inserting the CEC into the first compartment via an opening near the front side of the first compartment and sliding the CEC towards the back side of the first compartment, such that the CEC is mounted within a particular slot in the first compartment.

Figure 2A:
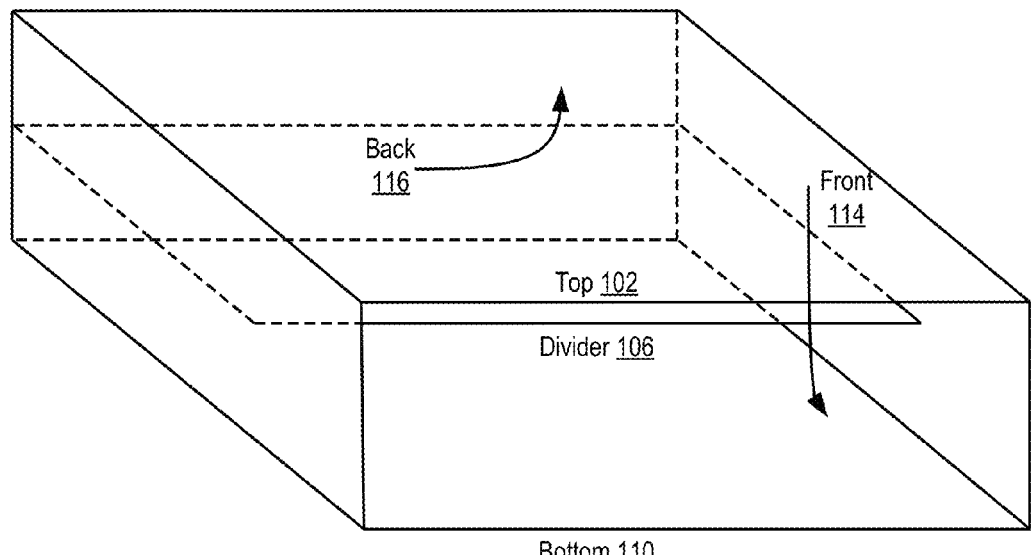
FIG. 2A sets forth a block diagram of a first compartment according to embodiments of the present invention.

For further explanation, FIG. 2A sets forth a block diagram of a first compartment according to embodiments of the present invention. The example depicted in FIG. 2A represents a three dimensional view of a first compartment according to embodiments of the present invention, where the first compartment is defined by a top (102) side, a bottom (110) side, a front (114) side, a back (118) side, a left-side wall (120), and a right-side wall (122).

Figure 2B:
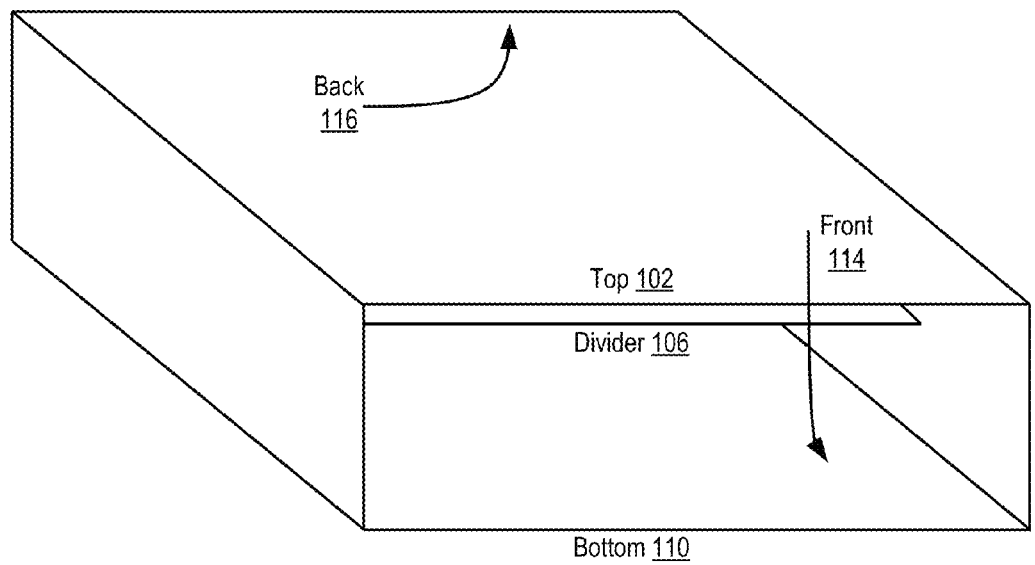
FIG. 2B sets forth a block diagram of a first compartment according to embodiments of the present invention.

For further explanation, FIG. 2B sets forth a block diagram of a first compartment according to embodiments of the present invention. The example depicted in FIG. 2B represents a three dimensional view of a first compartment according to embodiments of the present invention, where the first compartment is defined by a top (102) side, a bottom (110) side, a front (114) side, a back (118) side, a left-side wall (120), and a right-side wall (122). Readers will appreciate that the view depicted in FIG. 2A differs from the view depicted in FIG. 2B as the view depicted in FIG. 2A includes dotted lines representing structural aspects of the first compartment that would not otherwise be visible when viewing the first compartment from the angle depicted in FIG. 2A and FIG. 2B.

Figure 3A:
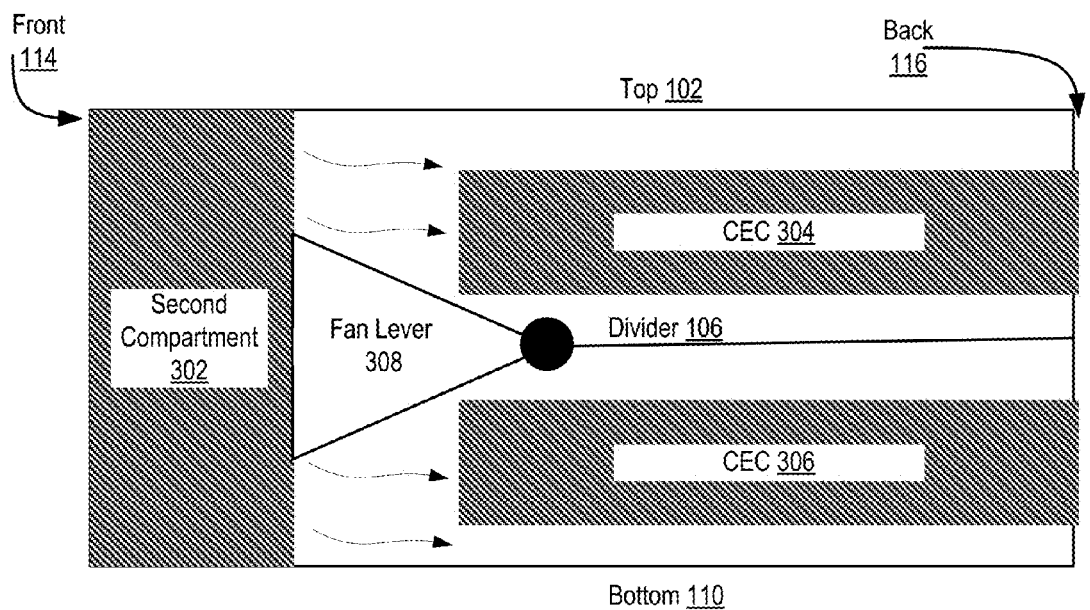
FIG. 3A sets forth a block diagram of a first compartment according to embodiments of the present invention.

For further explanation, FIG. 3A sets forth a block diagram of a first compartment according to embodiments of the present invention. FIG. 3A depicts a side-view of a first compartment that is defined by a top (102) side, a bottom (110) side, a front (114) side, and a back (118) side. In the example depicted in FIG. 3A, the first compartment includes two CECs (304, 306) inserted within the first compartment—a first CEC (304) that resides in the top portion of the first compartment and a second CEC (306) that resides in the bottom portion of the first compartment. In such an example, each CEC is mounted with the first compartment by inserting the CEC into the first compartment via an opening at the front (114) side of the first compartment and sliding the CEC towards the back (116) side of the first compartment, such that the CEC is mounted within a particular slot in the first compartment.

The example depicted in FIG. 3A also includes a second compartment (302) that is mounted within the first compartment via a fan lever (308). In such an example, the second compartment (302) is inserted within the first compartment when the second compartment (302) is in an operational position. The operational position represents a predetermined configuration where the fans, the second compartment, and the CECs are not being physically serviced by a system administrator. As such, the second compartment is positioned to provide airflow to each of the CECs which are assumed to be operating normally.

Readers will appreciate that although the example depicted in FIG. 3A illustrates an embodiment where the second compartment (302) is fully inserted within the first compartment when the second compartment (302) is in an operational position, other embodiments may exist where the second compartment (302) is only partially inserted within the first compartment when the second compartment (302) is in the operational position.

Figure 3B:
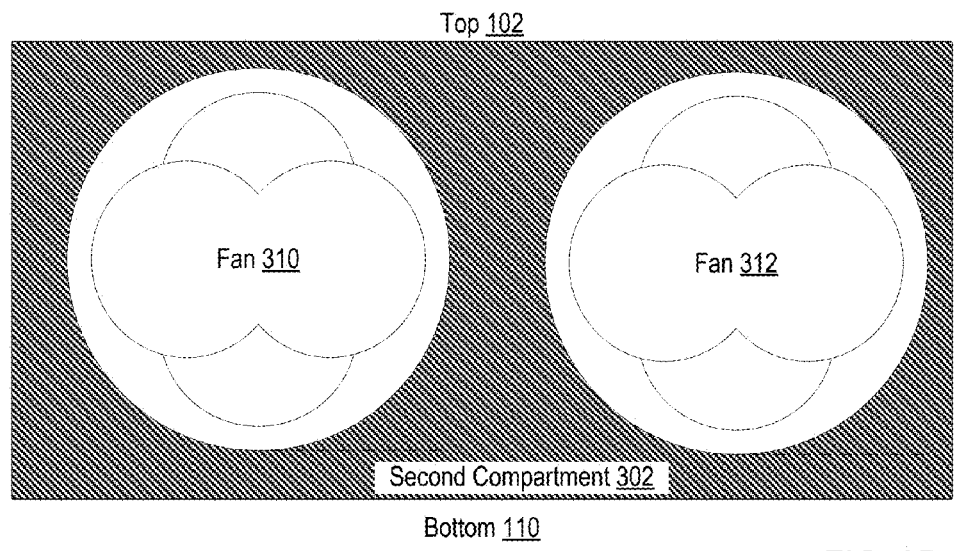
FIG. 3B sets forth a block diagram of a first compartment according to embodiments of the present invention.

For further explanation, FIG. 3B sets forth a block diagram of a first compartment according to embodiments of the present invention. FIG. 3B depicts a front-view of a first compartment that is defined by a top (102) side and a bottom (110) side. In the example depicted in FIG. 3B, the first compartment includes a second compartment (302) that is mounted within the first compartment via a fan lever. In such an example, the second compartment (302) is inserted within the first compartment when the second compartment (302) is in an operational position, such that two fans (310, 312) operate to cool the one or more CECs inserted into the first compartment.

In the examples depicted in FIGS. 3A and 3B, each fan (310, 312) in the second compartment (302) may be individually coupled to a power source. Readers will appreciate that because each fan (310, 312) in the second compartment (302) may be individually coupled to a power source, the fans (310, 312) may be hot swappable. That is, a first fan (310) may be removed without impacting the operations of the second fan (312), as the first fan (310) may be disconnected from its power source and removed from the second compartment (302) without needing to disconnect the second fan (312) from its power source or remove the second fan (312) from the second compartment (302).

In the examples depicted in FIGS. 3A and 3B, each CEC (304, 306) in the first compartment is also individually coupled to a power source. Readers will appreciate that because each CEC (304, 306) in the first compartment may be individually coupled to a power source, the CECs (304, 306) may be hot swappable. That is, a first CEC (304) may be removed without impacting the operations of the second CEC (306), as the first CEC (304) may be disconnected from its power source and removed from the first compartment without needing to disconnect the second CEC (306) from its power source or remove the second CEC (306) from the first compartment.

Figure 4A:
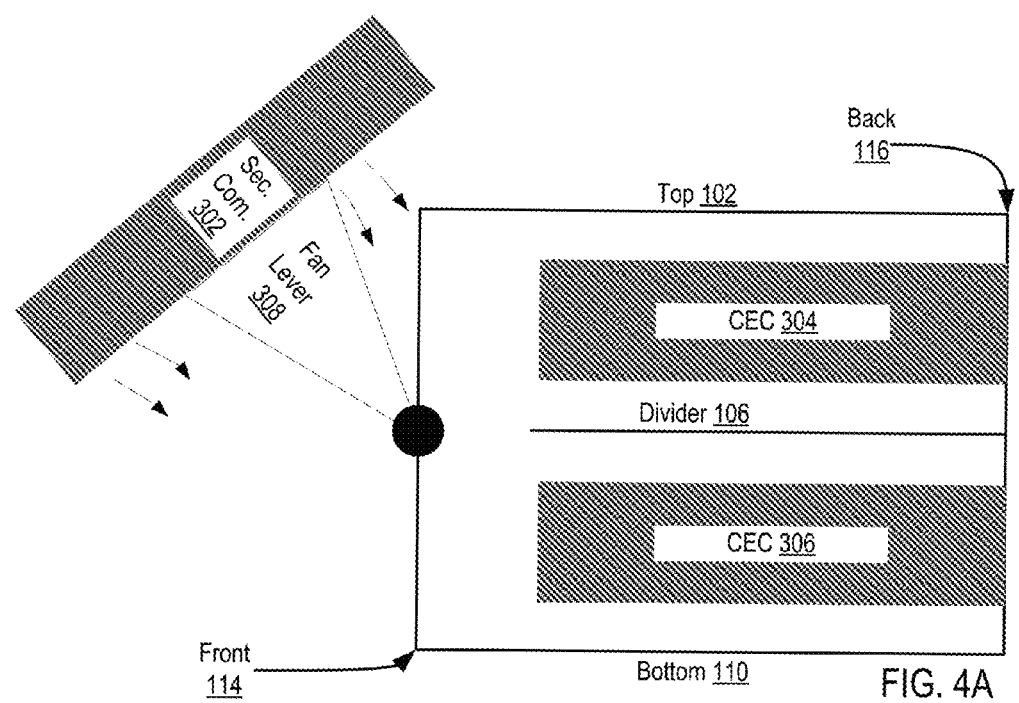
FIG. 4A sets forth a block diagram of a first compartment according to embodiments of the present invention.

For further explanation, FIG. 4A sets forth a block diagram of a first compartment according to embodiments of the present invention. FIG. 4A depicts a side-view of a first compartment that is defined by a top (102) side, a bottom (110) side, a front (114) side, and a back (118) side. In the example depicted in FIG. 4A, the first compartment includes two CECs (304, 306) inserted within the first compartment—a first CEC (304) that resides in the top portion of the first compartment and a second CEC (306) that resides in the bottom portion of the first compartment. In such an example, each CEC is mounted with the first compartment by inserting the CEC into the first compartment via an opening in the front (114) side of the first compartment and sliding the CEC towards the back (116) side of the first compartment, such that the CEC is mounted within a particular slot in the first compartment.

In the example depicted in FIG. 4A, the second compartment (302) is outside of the first compartment and rotated relative to the first compartment when the second compartment is in a service position. The service position is a predetermined configuration where the fans or the CECs are being serviced. In such an example, the fans or the CECs may be serviced when a system administrator is examining the fans, replacing one or more of the fans, examining the CECs, replacing one or more of the CECs, and so on. Readers will appreciate that when the second compartment (302) is outside of the first compartment and rotated relative to the first compartment, both the fans and the CECs may be more easily accessed for servicing.

In the example depicted in FIG. 4A, the second compartment (302) is configured to rotate up or down relative to the first compartment when the second compartment is in the service position. For example, the second compartment (302) in FIG. 4A is rotated upwards relative to the first compartment, such that greater access may be granted to the CEC (306) in the bottom portion of the first compartment while the fans in the second compartment continue to provide air flow to the CEC (304) in the top portion of the first compartment.

Figure 4B:
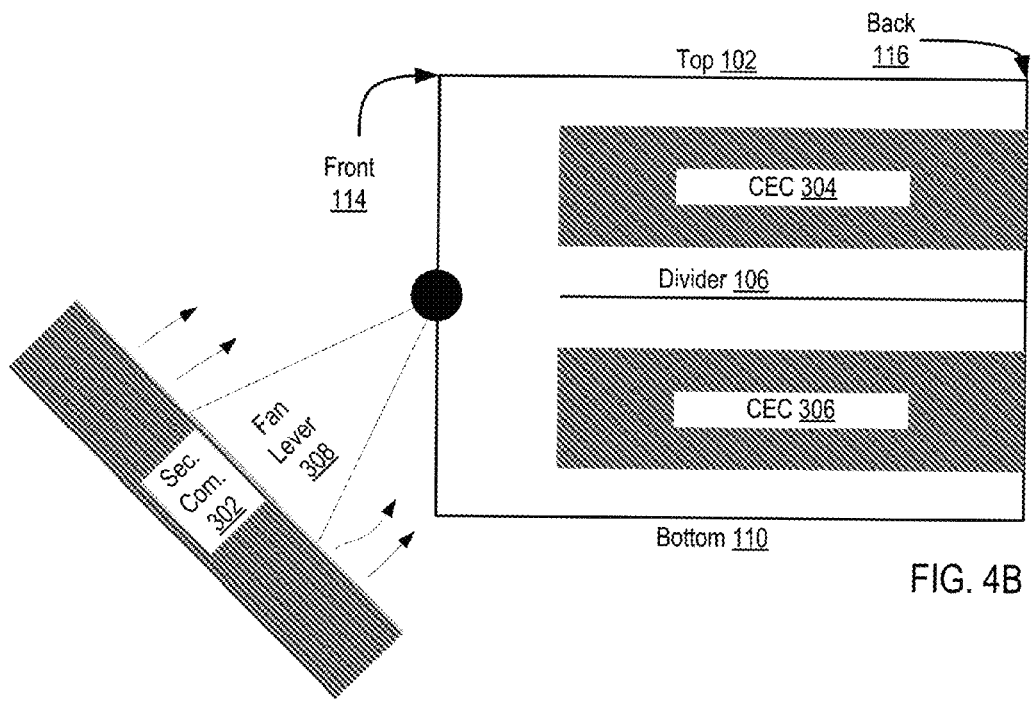
FIG. 4B sets forth a block diagram of a first compartment according to embodiments of the present invention.

For further explanation, FIG. 4B sets forth a block diagram of a first compartment according to embodiments of the present invention. In the example depicted in FIG. 4B, the second compartment (302) is also configured to rotate up or down relative to the first compartment when the second compartment is in the service position. In the example depicted in FIG. 4B, the second compartment (302) is rotated downward relative to the first compartment, such that greater access may be granted to the CEC (304) in the top portion of the first compartment while the fans in the second compartment continue to provide air flow to the CEC (306) in the bottom portion of the first compartment.

Readers will appreciate that the second compartment (302) may be transitioned from the position depicted in FIGS. 3A and 3B to the positions depicted in FIGS. 4A and 4B, for example, through the use of a rail mounted in the inside of the first compartment that couples the second compartment (302) to the first compartment. In such an example, the rail may run from the front (114) side of the first compartment to the end of the divider (106) that is closest to the front (114) side. As such, the second compartment (302) may be slid along such a rail to move the second compartment (302) between the operational position and the service position. Furthermore, mechanisms such as spring loaded latches and the like may be used to secure the second compartment (302) in position.

Readers will appreciate that will the use of a rail is described in the paragraph above as the mechanism by which the fan lever (and the second compartment (302) attached thereto) may be physically transitioned in and out of the first compartment, in additional embodiments other physical mechanisms may be used for the same purpose. Readers will further appreciate that while the examples depicted in FIGS. 4A and 4B describe a first compartment that is configured to receive a top CEC and a bottom CEC, and a second compartment that is configured to rotate up or down relative to the first compartment when the second compartment is in the service position, embodiments are contemplated where the first compartment is configured to receive a left CEC and a right CEC, and the second compartment is configured to rotate left or right relative to the first compartment when the second compartment is in the service position. In fact, such an embodiment could be depicted in FIGS. 4A and 4B if these views were top-views looking down on the first compartments, rather than side-views looking at a side of the first compartment.

Figure 5A:
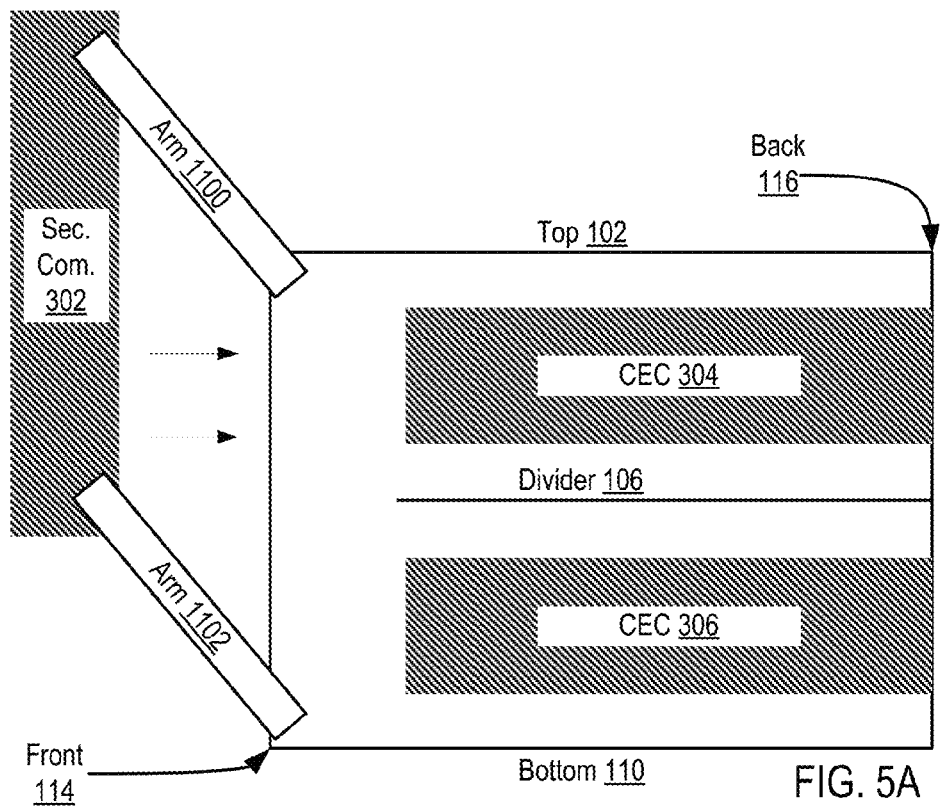
FIG. 5A sets forth a block diagram of a first compartment according to embodiments of the present invention.

For further explanation, FIG. 5A sets forth a block diagram of a first compartment according to embodiments of the present invention. FIG. 5A depicts a side-view of a first compartment that is defined by a top (102) side, a bottom (110) side, a front (114) side, and a back (118) side. In the example depicted in FIG. 5A, the first compartment includes two CECs (304, 306) inserted within the first compartment—a first CEC (304) that resides in the top portion of the first compartment and a second CEC (306) that resides in the bottom portion of the first compartment. In such an example, each CEC is mounted with the first compartment by inserting the CEC into the first compartment via an opening in the front (114) side of the first compartment and sliding the CEC towards the back (116) side of the first compartment, such that the CEC is mounted within a particular slot in the first compartment.

In the example depicted in FIG. 5A, the second compartment (302) is outside of the first compartment and rotated relative to the first compartment as the second compartment is in a service position. The service position is a predetermined configuration where the fans or the CECs are being serviced. In such an example, the fans or the CECs may be serviced when a system administrator is examining the fans, replacing one or more of the fans, examining the CECs, replacing one or more of the CECs, and so on. Readers will appreciate that when the second compartment (302) is outside of the first compartment and rotated relative to the first compartment, both the fans and the CECs may be more easily accessed for servicing.

In the example depicted in FIG. 5A, the second compartment (302) is coupled to the first compartment via two arms (1100, 1102). Such arms (1100, 1102) may be embodied, for example, as metals rods that include physical mechanisms for securing the first compartment to one end of the arms (1100, 1102) and physical mechanisms for securing the second compartment to the opposing end of the arms (1100, 1102). Although the example depicted in FIG. 5A illustrates an example in which the second compartment (302) is rotated in an upward direction relative to the first compartment (thereby increasing access to the CEC (306) mounted in the bottom (110) portion of the first compartment), readers will appreciate that the second compartment (302) may also be rotated in a downward direction relative to the first compartment (thereby increasing access to the CEC (304) mounted in the top (102) portion of the first compartment).

Readers will appreciate that while the bottom arm (1102) may appear to block access to the CEC (306) mounted in the bottom (110) portion of the first compartment, this is a result only of the view depicted in FIG. 5A. Readers will appreciate that each arm (1100, 1102) may be attached to side walls of the first compartment—such as the left-side wall (120 of FIGS. 1B, 2A, and 2B) the right-side wall (122 of FIGS. 1B, 2A, and 2B) depicted in previous figures. As such, the arms (1100, 1102) do not block the opening in the front (114) side of the first compartment that is used to remove and insert CECs (304, 306) into the first compartment.

Figure 5B:
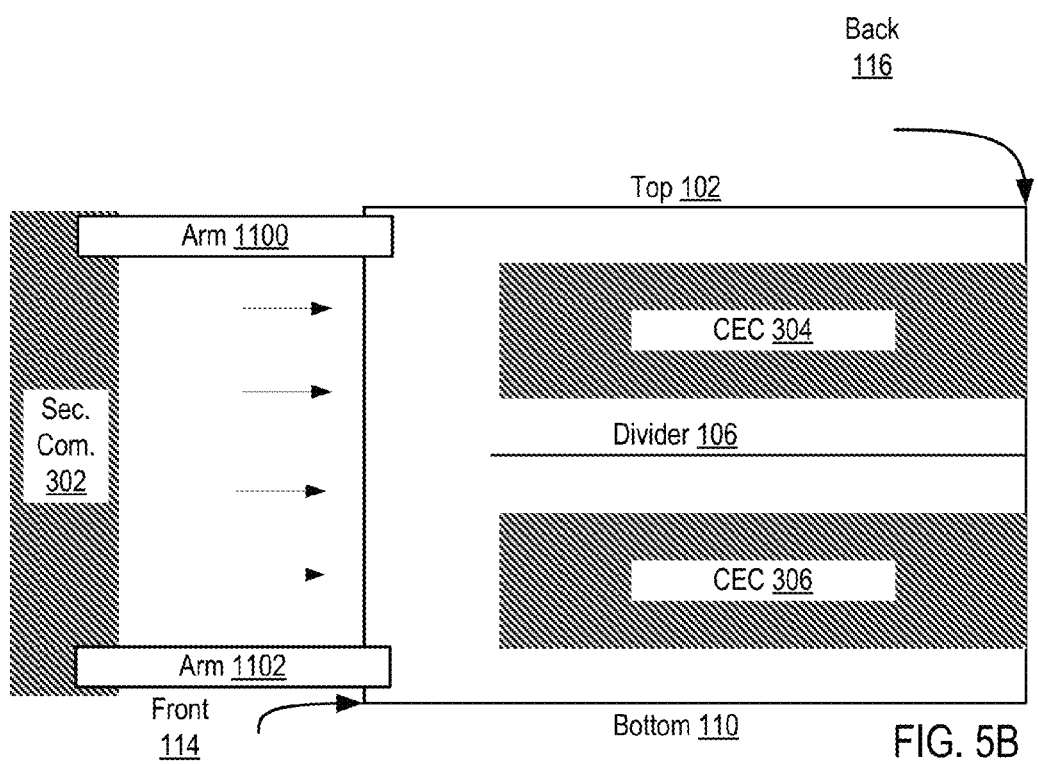
FIG. 5B sets forth a block diagram of a first compartment according to embodiments of the present invention.

For further explanation, FIG. 5B sets forth a block diagram of a first compartment according to embodiments of the present invention. FIG. 5B depicts a side-view of a first compartment that is defined by a top (102) side, a bottom (110) side, a front (114) side, and a back (118) side. In the example depicted in FIG. 5B, the second compartment (302) is illustrated as being in a transitional position between the service position and the operational position. In such an example, to place the second compartment (302) in the service position, the second compartment (302) would simply need to be rotated upward or downward relative to the first component, thereby increasing physical access to one of the CECs (304, 306). To place the second compartment (302) in the operational position, the second compartment (302) would simply need to be slid towards the back of the first compartment. In such an example, each arm (1100, 1102) may be mounted on a rail within the first compartment that enables the arm (1100, 1102) and the second compartment (302) to be slid towards the back (116) of the first compartment. Readers will appreciate that physical mechanisms other than a rail may also be utilized to enable the arms (1100, 1102) to recede into the first compartment and also to enable the arms (1100, 1102) to extrude from the first compartment.

Figure 6:
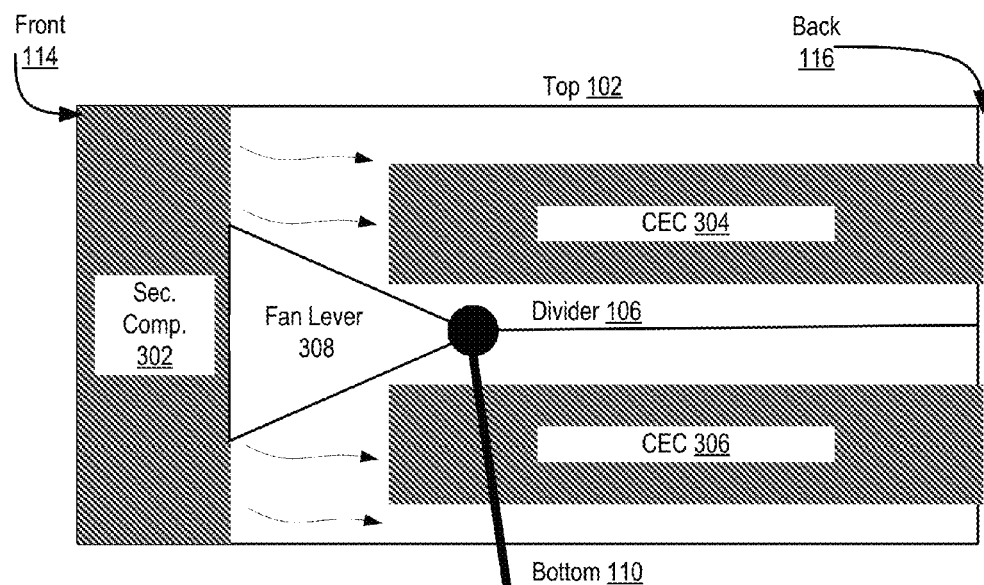
FIG. 6 sets forth a block diagram of a first compartment according to embodiments of the present invention.
Figure 6:
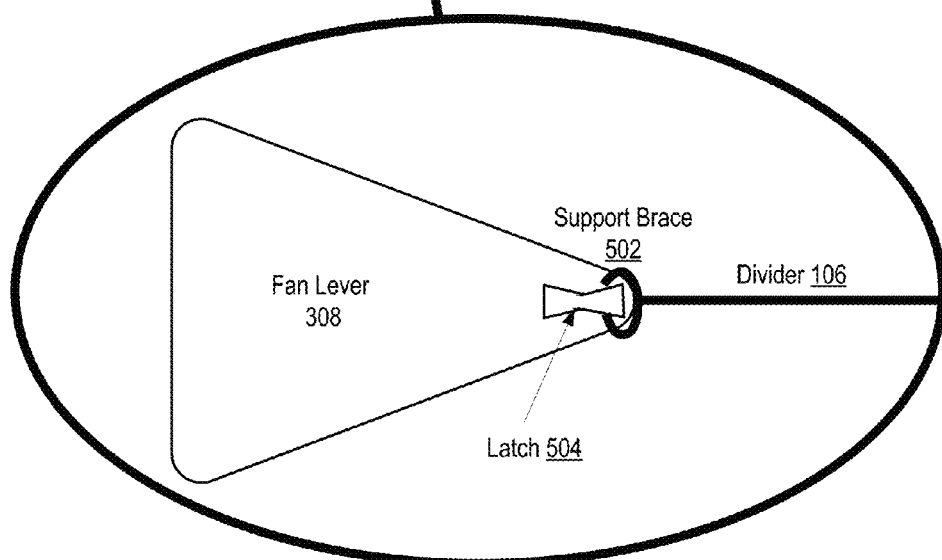

For further explanation, FIG. 6 sets forth a block diagram of a first compartment according to embodiments of the present invention. FIG. 6 depicts a side-view of a first compartment that is defined by a top (102) side, a bottom (110) side, a front (114) side, and a back (118) side. In the example depicted in FIG. 6, the first compartment includes two CECs (304, 306) that are inserted within the first compartment—a first CEC (304) that resides in the top portion of the first compartment and a second CEC (306) that resides in the bottom portion of the first compartment. In such an example, each CEC is mounted within the first compartment by inserting the CEC into the first compartment via an opening in the front (114) side of the first compartment and sliding the CEC towards the back (116) side of the first compartment, such that the CEC is mounted within a particular slot in the first compartment. In the example depicted in FIG. 6, the second compartment (302) is inserted within the first compartment as the second compartment (302) is in an operational position.

FIG. 6 illustrates an embodiment in which the fan lever (308) includes a locking mechanism for securing the second compartment (302) in a non-rotated position relative to the first compartment when the second compartment (308) is in the operational position. In the example depicted in FIG. 6, the locking mechanism is embodied as a latch physically configured for securing the second compartment (302) in an operational position where the second compartment (302) is in a non-rotated position relative to the first compartment. In such an example, a support brace (502) may be attached to the divider (106), where the support brace (502) is a flexible structure that can accept the insertion of a latch (504) that is attached to the fan lever (308) when the second compartment (302) is being placed into the operational position. Such a support brace (502) may be sufficiently flexible to release the latch (504) when the second compartment (302) is being placed into the service position, such as when a user pulls the second compartment (302) away from the back (116) side of the first compartment.

Although the example depicted in FIG. 6 illustrates one embodiment of a mechanism for securing the second compartment (302) in a position where the second compartment (302) is inserted in the first compartment, readers will appreciate that in other embodiments different locking mechanisms may be utilized.

Figure 7:
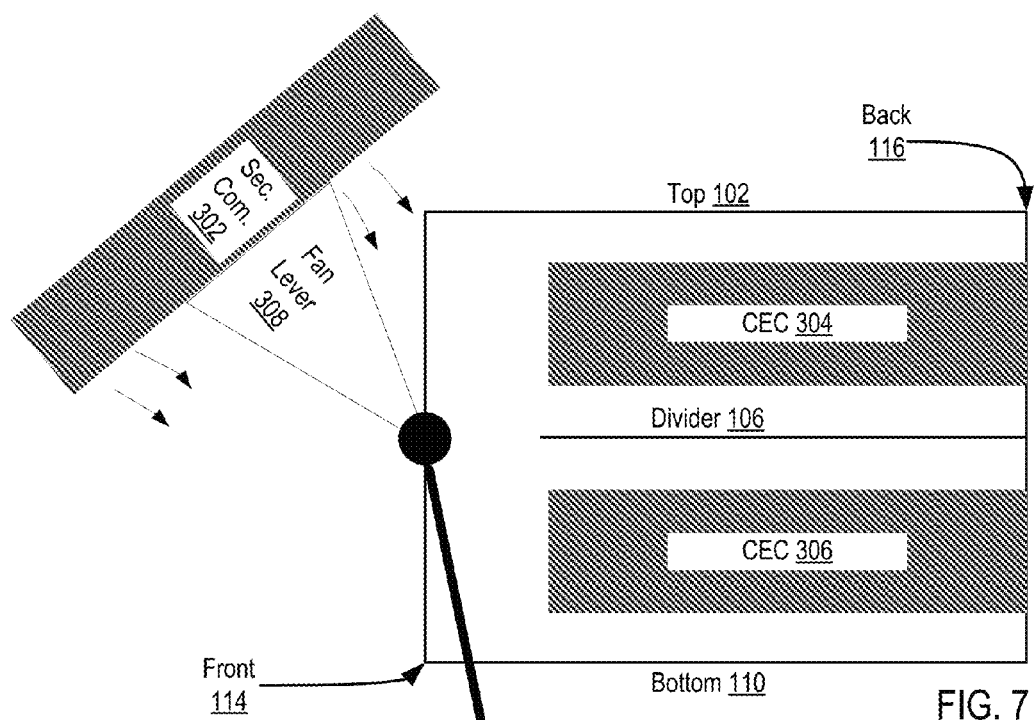
FIG. 7 sets forth a block diagram of a first compartment according to embodiments of the present invention.
Figure 7:
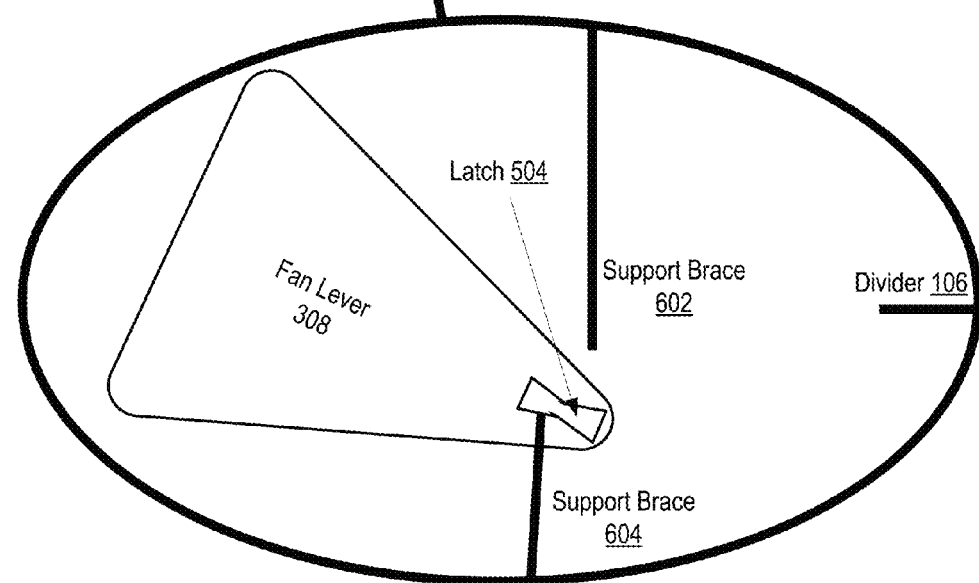

For further explanation, FIG. 7 depicts a side-view of a first compartment that is defined by a top (102) side, a bottom (110) side, a front (114) side, and a back (118) side. In the example depicted in FIG. 7, the first compartment includes two CECs (304, 306) that are inserted within the first compartment—a first CEC (304) that resides in the top portion of the first compartment and a second CEC (306) that resides in the bottom portion of the first compartment. In such an example, each CEC (304, 306) is mounted within the first compartment by inserting the CEC into the first compartment via an opening in the front (114) side of the first compartment and sliding the CEC towards the back (116) side of the first compartment, such that the CEC is mounted within a particular slot in the first compartment. In the example depicted in FIG. 7, the second compartment (302) is rotated up relative to the first compartment, such that the second compartment (302) is in the service position and greater access may be granted to the lower CEC (306) while the fans in the second compartment (302) continue to provide air flow to the CEC (304) mounted in the top portion of the first compartment.

FIG. 7 illustrates an embodiment in which the fan lever (308) includes a locking mechanism for securing the second compartment (302) in a rotated position relative to the first compartment when the second compartment is in a service position. In the example depicted in FIG. 7, the locking mechanism is embodied as a latch (504) that is attached to the fan lever (308) and is physically configured to secure the second compartment (302) in a rotated position relative to the first compartment when the second compartment is in a service position. In such an example, a support brace (604) may be attached to the top (102) side of the first compartment and another support brace (602) may be attached to the bottom (110) side of the first compartment. In such an example, the physical relationship between the latch (504) and the support braces (602, 604) may dictate that when the second compartment (302) is in a first service position—rotated upwards relative to the first compartment—the CEC (306) mounted in the bottom portion of the first compartment is accessible for servicing. Likewise, the physical relationship between the latch (504) and the support braces (602, 604) may dictate that when the second compartment (302) is in a second service position—rotated downwards relative to the first compartment—the CEC (304) mounted within the top portion of the first compartment is accessible for servicing.

Figure 8:
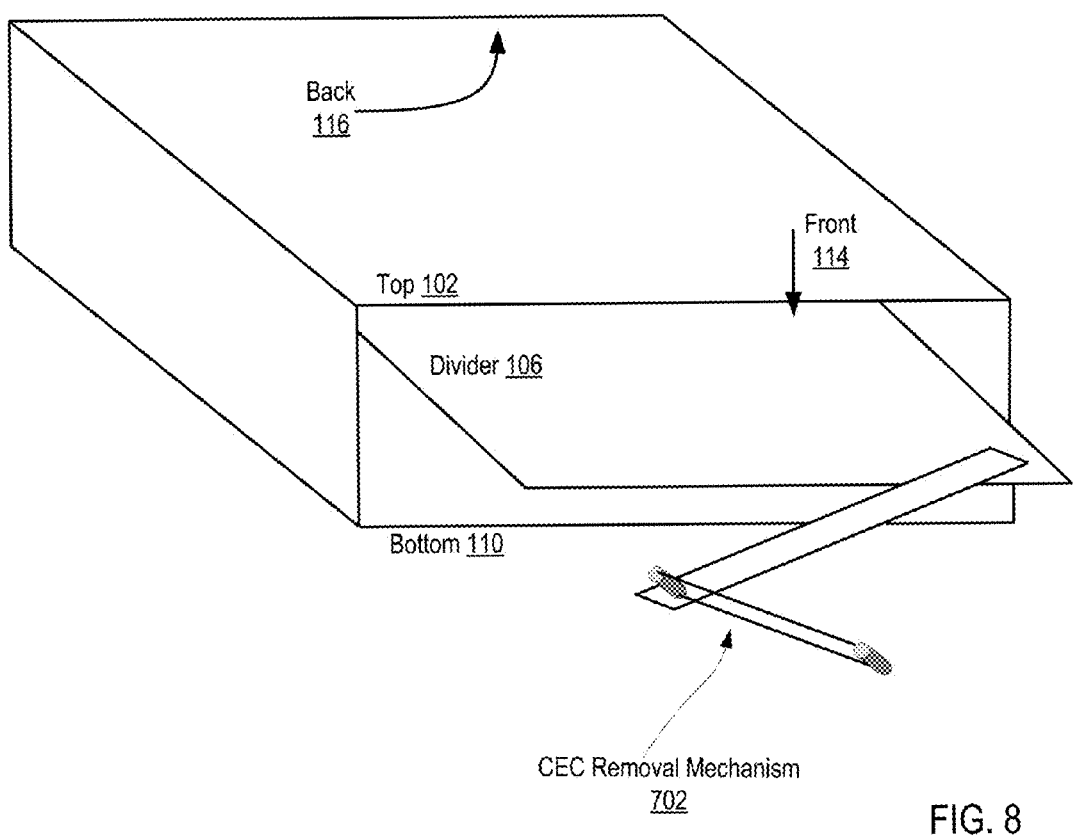
FIG. 8 sets forth a block diagram of a first compartment according to embodiments of the present invention.

For further explanation, FIG. 8 sets forth a block diagram of a first compartment according to embodiments of the present invention. The example depicted in FIG. 8 represents a three dimensional view of a first compartment according to embodiments of the present invention, where the first compartment is defined by a top (102) side, a bottom (110) side, a front (114) side, and a back (118) side.

In the example depicted in FIG. 8, the first compartment further comprises a CEC removal mechanism (702). The CEC removal mechanism (702) depicted in FIG. 8 may be embodied as a spring loaded lever arm attached to the divider (106) that separates the top CEC and the bottom CEC. In such an example, the divider (106) that separates the top CEC and the bottom CEC may be affixed to a grove, rail, or other mechanism such that a system administrator can pull the divider (106) and an attached CEC out of the first compartment via the CEC removal mechanism (702).

As such, the CEC removal mechanism (702) may be used to pull a particular CEC out of the first compartment.

Readers will appreciate that although the example depicted in FIG. 8 shows the CEC removal mechanism (702) attached to the divider (106), the CEC removal mechanism (702) may be attached directly to the CEC itself or attached to some other mechanical component such that pulling the CEC removal mechanism (702) out of the first compartment causes a CEC to also transition to a location at least partially outside the first compartment. Furthermore, multiple CEC removal mechanisms (702) may be incorporated, such that each CEC has an associated CEC removal mechanism (702).

Figure 9A:
FIG. 9A sets forth a block diagram of a first compartment according to embodiments of the present invention.
Figure 9B:
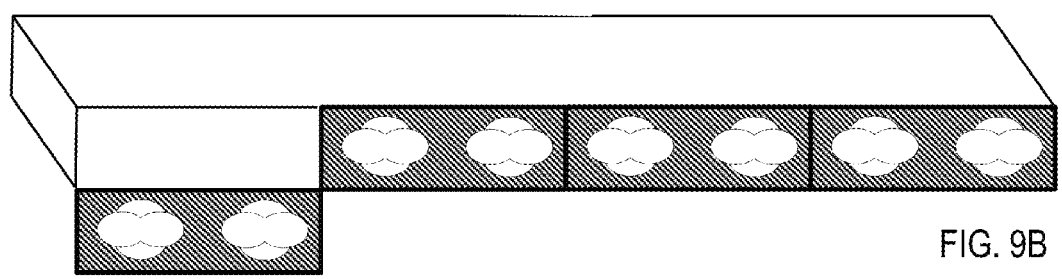
FIG. 9B sets forth a block diagram of a first compartment according to embodiments of the present invention.

For further explanation, FIGS. 8A and 8B set forth block diagrams of computing devices (802) that include a plurality of populated first compartments and second compartments. In such an example, each first compartment may be populated with two or more CECs. Likewise, each second compartment may be populated by two or more fans. In the example depicted in FIG. 9A, each of the second compartments is in the operational position. In the example depicted in FIG. 9B, however, one of the second compartments is in the service position while the remaining second compartments are in the operational position.

Figure 10:
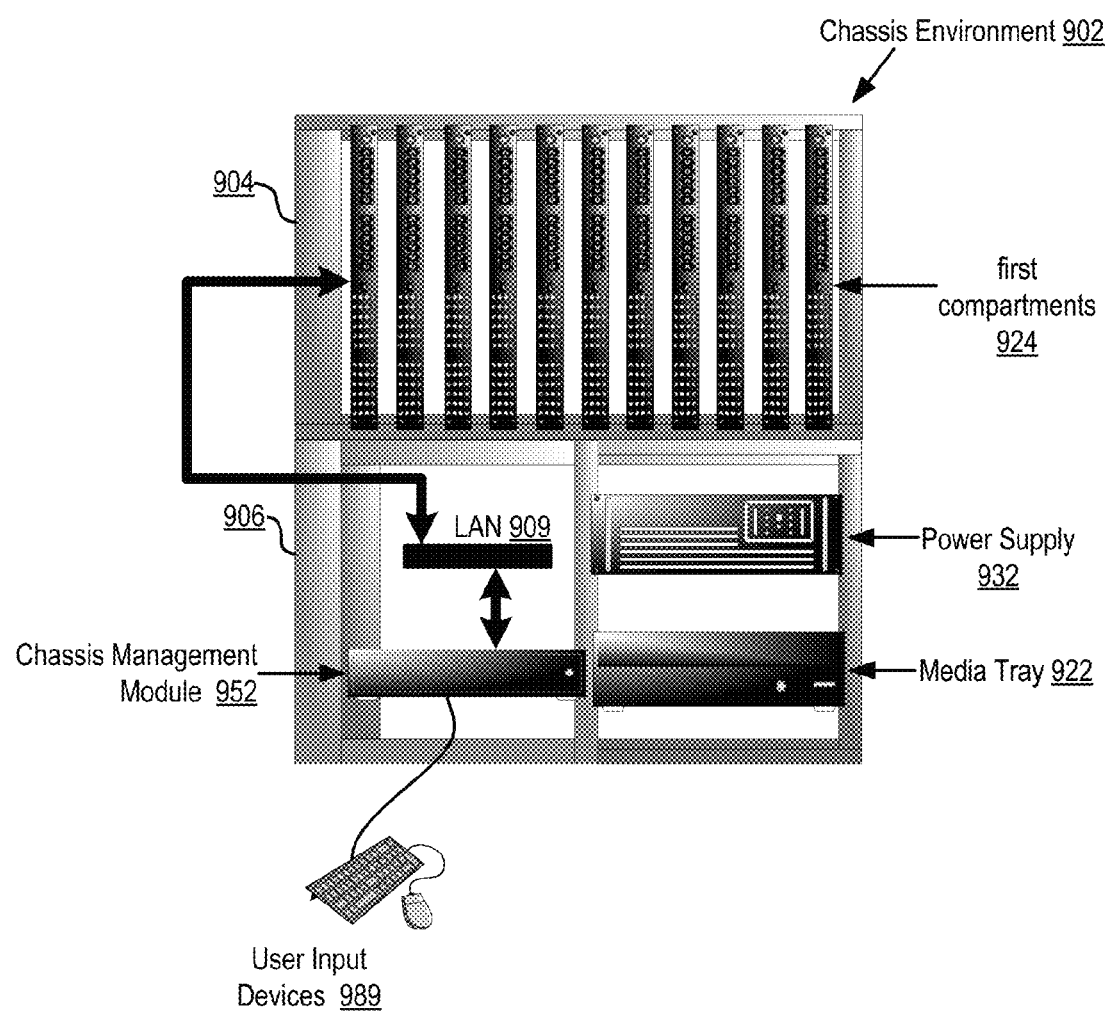
FIG. 10 sets forth a diagram of an example data processing system according to embodiments of the present invention.

For further explanation, FIG. 10 sets forth a diagram of an example data processing system according to embodiments of the present invention. The data processing system of FIG. 10 includes a chassis environment (902). A 'chassis environment,' as the term is used in this specification, refers generally to a modular server system. The modular server system in the example depicted in FIG. 10 is installed in a two-bay chassis (904, 906) and includes one or more of first compartments (924) and, although not illustrated, one or more second compartments mounted to each first compartment (924) in the operational position. The chassis environment (902) also includes one or more chassis management modules (952), one or more media trays (922), and one or more blade server system power supplies (932).

The chassis management module (952) of FIG. 10 may be embodied as a computer, including software and hardware components, one or more computer processors and computer memory, that provides system management functions for components in the example chassis environment (902), including the CECs within the first compartments (924), and the media tray (922). The chassis management module (952) of FIG. 10 may also make available connections for user input devices such as mice or keyboards (989) that are not generally connected directly to the CECs within the first compartments (924) or to the chassis itself.

The chassis environment (902) of FIG. 10 also includes one or more CECs within the first compartments (924). The CECs within the first compartments (924) of FIG. 10 are installed in cabinet bay (904) of the example chassis environment (902). Such CECs within the first compartments (924) are computing devices implemented in modular form factor. The CECs within the first compartments (924) may share access to the media tray (922) and may be connected to one another and to the chassis management module (952) for data communications through a local area network ('LAN') (909), which may be embodied as a small network installed within the chassis environment.

The chassis environment (902) of FIG. 10 also includes one or more media trays (922). The one or more media trays (922) in FIG. 10 may house non-volatile memory media generally. A media tray (922) may typically include Compact Disc read-only media drives ('CD-ROM'), Digital Video Disc ROM drives (DVD-ROM), CD-RW drives, DVD-RW drives, floppy disk drives, and so on as will occur those of skill in the art.

The arrangement of the chassis environment (902), network (909), and other devices making up the example system illustrated in FIG. 10 are for explanation, not for limitation. Data processing systems useful according to various embodiments of the present invention may include additional servers, routers, and other devices, not shown in FIG. 10, as will occur to those of skill in the art. Networks in such data processing systems may support many data communications protocols, including Transmission Control Protocol ('TCP'), Internet Protocol ('IP'), HyperText Transfer Protocol ('HTTP'), Wireless Access Protocol ('WAP'), Handheld Device Transport Protocol ('HDTP'), and others as will occur to those of skill in the art. Various embodiments of the present invention may be implemented on a variety of hardware platforms in addition to those illustrated in FIG. 10.

Readers will appreciate that the embodiments described above create the ability to service an individual CEC while allowing another CEC within the system to remain operational as the operational CECs continue to be cooled even with the fans are in the service position. In such a way, servicing an individual CEC can be accomplished in a way that requires less system down time and less disruption to the operation of the system.

Figure 11:
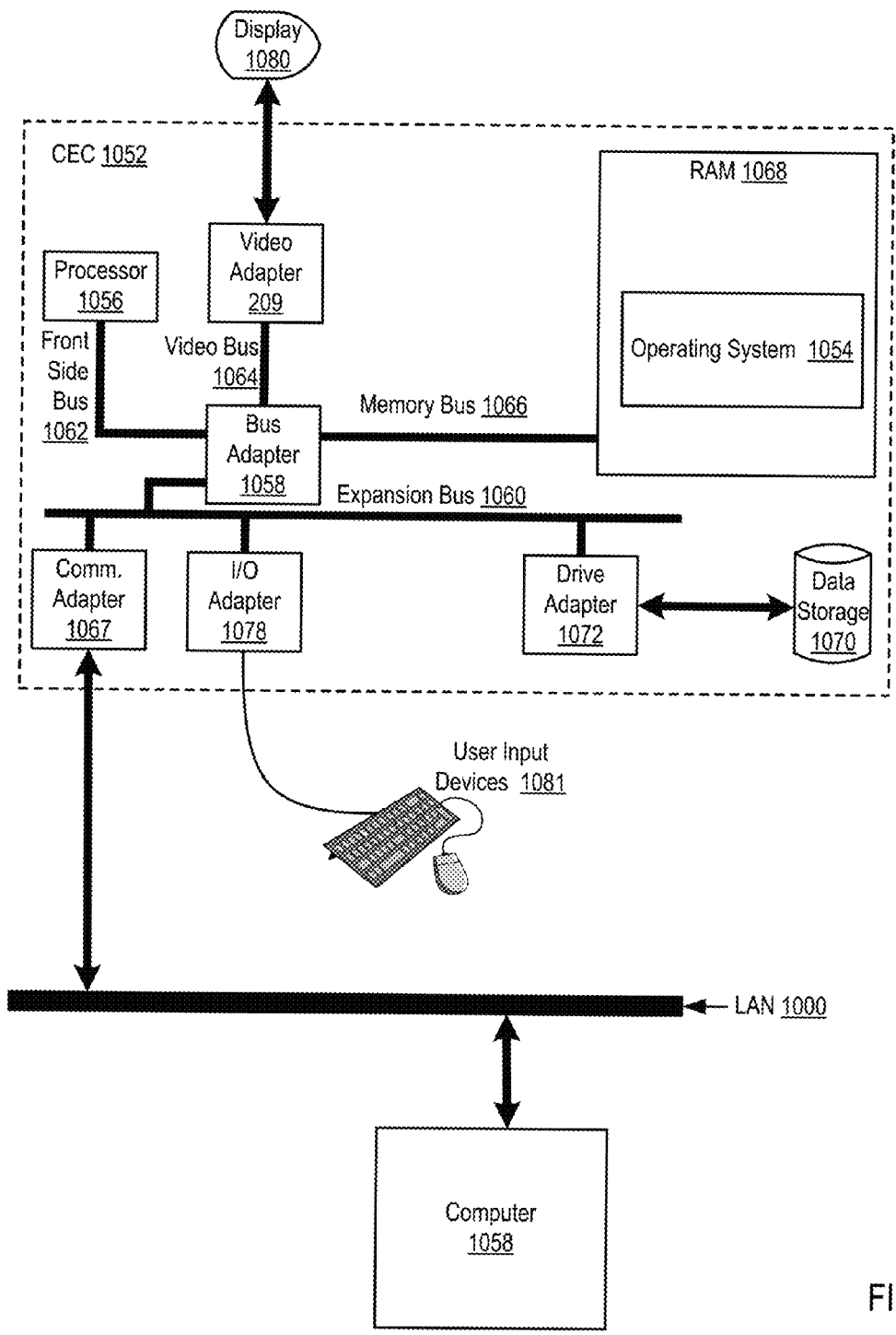
FIG. 11 sets forth a block diagram of automated computing machinery comprising an example CEC according to embodiments of the present invention.

For further explanation, therefore, FIG. 11 sets forth a block diagram of automated computing machinery comprising an example CEC (1052) according to embodiments of the present invention. The CEC (1052) of FIG. 11 includes at least one computer processor (1056) or 'CPU' as well as random access memory (1068) ('RAM') which is connected through a high speed memory bus (1066) and bus adapter (1058) to processor (1056) and to other components of the CEC (1052).

Stored in RAM (1068) is an operating system (1054). Operating systems useful in embodiments of the present invention include UNIX™, Linux™, Microsoft XP™, AIX™, IBM's i5/OS™, and others as will occur to those of skill in the art. The operating system (1054) in the example of FIG. 11 is shown in RAM (1068), but many components of such software typically are stored in non-volatile memory also, such as, for example, on a disk drive (1070).

The CEC (1052) of FIG. 11 includes disk drive adapter (1072) coupled through expansion bus (1060) and bus adapter (1058) to processor (1056) and other components of the CEC (1052). Disk drive adapter (1072) connects non-volatile data storage to the CEC (1052) in the form of disk drive (1070). Disk drive adapters according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example CEC (1052) of FIG. 11 includes one or more input/output ('I/O') adapters (1078). I/O adapters implement user-oriented input/output through, for example, software drivers and computer hardware for controlling output to display devices such as computer display screens, as well as user input from user input devices (1081) such as keyboards and mice. The example CEC (1052) of FIG. 11 includes a video adapter (209), which is an example of an I/O adapter specially designed for graphic output to a display device (1080) such as a display screen or computer monitor. Video adapter (209) is connected to processor (1056) through a high speed video bus (1064), bus adapter (1058), and the front side bus (1062), which is also a high speed bus.

The example CEC (1052) of FIG. 11 includes a communications adapter (1067) for data communications with other computers (1082) and for data communications with a data communications network (1000). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters according to embodiments of the present invention include modems for wired dial-up communications, Ethernet (IEEE 802.3) adapters for wired data communications network communications, and 802.11 adapters for wireless data communications network communications.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A server chassis, comprising:
a first compartment configured to receive one or more central electronics complexes ('CECs') through a front of the server chassis; and
a second compartment including one or more fans for cooling the one or more CECs, wherein the second compartment is coupled to a front of the first compartment by a pivot attached to a center of the front of the first compartment such that:
the second compartment is inserted within the first compartment when the second compartment is in an operational position and blocks access to the first compartment; and
the second compartment is outside of the first compartment and rotated around the pivot relative to the first compartment when the second compartment is in a service position and permits access to the first compartment.

2. The server chassis of claim 1 wherein:
the first compartment receives a top CEC and a bottom CEC; and
the second compartment rotates up or down relative to the first compartment when the second compartment is in the service position.

3. The server chassis of claim 1 wherein:
the first compartment receives a left CEC and a right CEC; and
the second compartment rotates left or right relative to the first compartment when the second compartment is in the service position.

4. The server chassis of claim 1 further comprising a locking mechanism for securing the second compartment in a non-rotated position relative to the first compartment when the second compartment is in the operational position.

5. The server chassis of claim 1 further comprising a locking mechanism for securing the second compartment in a rotated position relative to the first compartment when the second compartment is in a service position.

6. The server chassis of claim 1 wherein the first compartment further comprises a CEC removal mechanism.

7. The server chassis of claim 1 wherein the second compartment further comprises a plurality of fans, each fan in the second compartment individually coupled to a power source.

8. The server chassis of claim 1 wherein the first compartment further comprises a plurality of CECs, each CEC in the first compartment individually coupled to a power source.

9. A system comprising:
a first compartment that includes one or more central electronics complexes ('CECs'); and
a second compartment that includes one or more fans for cooling the one or more CECs, wherein the second compartment is coupled to a front of the first compartment by a pivot attached to a center of the front of the first compartment and the CECs are received into the front of the first compartment such that:
the second compartment is inserted within the first compartment when the second compartment is in an operational position and blocks access to the first compartment; and
the second compartment is outside of the first compartment and rotated relative to the first compartment when the second compartment is in a service position and permits access to the first compartment.

10. The system of claim 9 wherein:
the first compartment includes a top CEC and a bottom CEC; and
the second compartment rotates up or down relative to the first compartment when the second compartment is in the service position.

11. The system of claim 9 wherein:
the first compartment includes a left CEC and a right CEC; and
the second compartment rotates left or right relative to the first compartment when the second compartment is in the service position.

12. The system of claim 9 further comprising a locking mechanism for securing the second compartment in a non-rotated position relative to the first compartment when the second compartment is in the operational position.

13. The system of claim 9 further comprising a locking mechanism for securing the second compartment in a rotated position relative to the first compartment when the second compartment is in a service position.

14. The system of claim 9 wherein the first compartment further comprises a CEC removal mechanism.

15. The system of claim 9 wherein each fan in the second compartment is individually coupled to a power source.

16. The system of claim 9 wherein each CEC in the first compartment is individually coupled to a power source.

* * * * *